United States Patent
Yanagigawa

[11] Patent Number: 6,002,158
[45] Date of Patent: Dec. 14, 1999

[54] HIGH BREAKDOWN-VOLTAGE DIODE WITH ELECTRIC-FIELD RELAXATION REGION

[75] Inventor: Hiroshi Yanagigawa, Shiga, Japan

[73] Assignee: NEC Corporation, Tokyo, Japan

[21] Appl. No.: 08/998,923

[22] Filed: Dec. 29, 1997

[30] Foreign Application Priority Data

Dec. 27, 1996 [JP] Japan .................................... 8-349821

[51] Int. Cl.⁶ .................................................. H01L 23/58
[52] U.S. Cl. .......................... 257/492; 257/488; 257/545
[58] Field of Search .................................... 257/488, 491, 257/492, 494, 544, 515, 487, 496, 545

[56] References Cited

U.S. PATENT DOCUMENTS

| | | | |
|---|---|---|---|
| 4,242,697 | 12/1980 | Berthold et al. .......................... | 257/146 |
| 4,713,681 | 12/1987 | Beasom .................................. | 257/336 |
| 5,241,210 | 8/1993 | Nakagawa et al. ...................... | 257/487 |
| 5,631,491 | 5/1997 | Matsuzaki ............................... | 257/487 |

FOREIGN PATENT DOCUMENTS

5-190874  7/1993  Japan .

*Primary Examiner*—Mahshid Saadat
*Assistant Examiner*—George C. Eckert, II
*Attorney, Agent, or Firm*—Foley, Hoag & Eliot LLP

[57] ABSTRACT

A high breakdown-voltage diode is provided, which has a decreased chip area and a low electric resistance between anode and cathode regions after the breakdown phenomenon takes place. A semiconductor layer of a first conductivity type is vertically isolated by a first isolation dielectric and laterally isolated by a second isolation dielectric from outside. A first diffusion region of a second conductivity type is formed in a surface area of the semiconductor layer, thereby forming a first p-n junction. A second diffusion region of the first conductivity type is formed in the surface area to be apart from the first diffusion region. A third diffusion region of the second conductivity type is formed in the surface area between the first and second diffusion regions, thereby forming a second p-n junction. The third diffusion region is electrically connected to the first diffusion region. A depletion region formed at the second p-n junction grows according to a reverse voltage applied across the first and second diffusion regions, so that each end of the depletion region extends to a surface of the third diffusion region and to the first isolation dielectric while no breakdown occurs at the first p-n junction, relaxing an electric filed existing near the first p-n junction.

16 Claims, 5 Drawing Sheets

FIG. 10

HIGH BREAKDOWN-VOLTAGE DIODE WITH ELECTRIC-FIELD RELAXATION REGION

BACKGROUND OF THE INVENTION

1. Field of the Invention

The present invention relates to a diode and more particularly, to a high breakdown-voltage diode having an electric-field relaxation region relaxing an electric field existing in the vicinity of a p-n junction.

2. Description of the Prior Art

In recent years, Silicon On Insulator (SOI) wafers or substrates have been widely used for fabricating high withstand-voltage semiconductor elements or components and semiconductor integrated circuit devices in which high withstand-voltage semiconductor elements or components and related circuits are mounted on a same semiconductor chip. This is because an SOI substrate increases the isolation withstand voltage of electronic elements or components implemented thereon.

Figure 1:
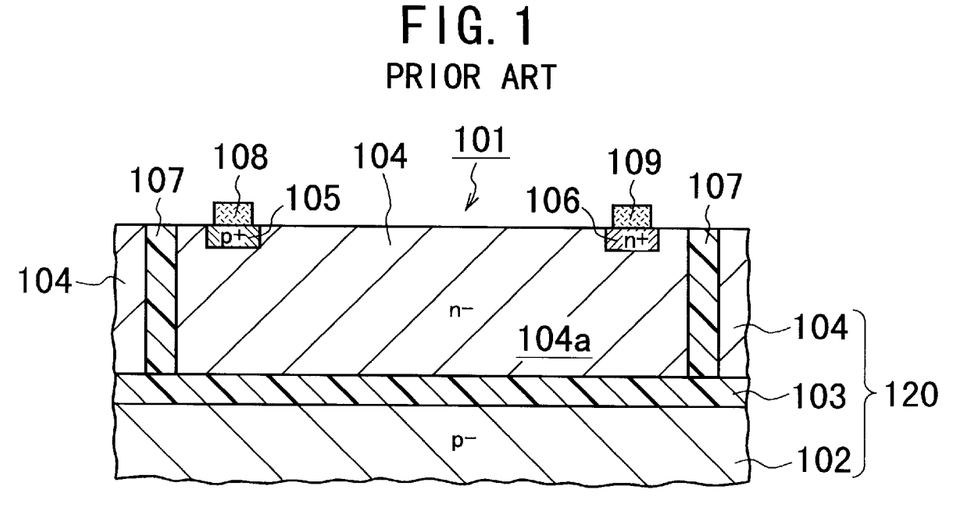
FIG. 1 is a partial cross-sectional view of a conventional high breakdown-voltage diode formed on an SOI substrate.

FIG. 1 shows a partial cross section of a conventional high breakdown-voltage diode formed on an SOI substrate. This diode has a breakdown voltage of 150 V.

In FIG. 1, the conventional high breakdown-voltage diode 101 includes an SOI substrate 120. This substrate 120 consists of a p$^-$-type single-crystal silicon supporting plate 102, a silicon dioxide (SiO$_2$) layer 103 formed on the plate 102, and an n$^-$-type single-crystal silicon layer 104 formed on the SiO$_2$ layer 103. The p$^-$-type supporting plate 102 has a doping concentration of $1\times10^{14}$ atoms/cm$^3$. The SiO$_2$ layer 103 has a thickness of 1 $\mu$m. The n$^-$-type single-crystal silicon layer 104 has a doping concentration of $5\times10^{15}$ atoms/cm$^3$ and a thickness of 5 $\mu$m.

An isolation region 107 made of SiO$_2$ is formed in the n$^-$-type silicon layer 104 to surround an area where the diode 101 is formed, defining a rectangular-shaped device region 104$a$ in the layer 104. The device region 104$a$ is laterally isolated by the isolation region 107 and vertically isolated by the SiO$_2$ layer 103 from other electronic elements or components located outside the device region 104$a$.

A p$^+$-type diffusion region 105 serving as an anode region of the diode 101 is formed in the surface area of the device region 104$a$ by selective diffusion. The surface of the p$^+$-type anode region 105 is exposed from the single-crystal silicon layer 104 and is apart from the isolation region 107. The anode region 105 has a doping concentration of $1\times10^{19}$ atoms/cm$^3$ and a depth of 1 $\mu$m from the surface of the layer 104. An n$^+$-type diffusion region 106 serving as a cathode region of the diode 101 is formed in the surface area of the device region 104$a$ by selective diffusion. The surface of the n$^+$-type cathode region 106 is exposed from the single-crystal silicon layer 104 and apart from the isolation region 107 and from the anode region 105. The cathode region 106 is formed in such a way that the distance between the opposing edges of the anode and cathode regions 105 and 106 is 15 $\mu$m. The cathode region 106 has a doping concentration of $1\times10^{19}$ atoms/cm$^3$ and a depth of 1 $\mu$m from the surface of the layer 104.

An anode electrode 108 is formed on the exposed surface of the p$^+$-type anode region 105. The anode electrode 108 is electrically connected to the anode region 105.

A cathode electrode 109 is formed on the exposed surface of the n$^+$-type cathode region 106. The cathode electrode 109 is electrically connected to the cathode region 106.

With the conventional high breakdown-voltage diode 101 shown in FIG. 1, when a reverse voltage is applied across the anode and cathode electrodes 108 and 109 on operation, an electric field is generated in the device region 104$a$ between the p$^+$-type anode region 105 and the n$^+$-type cathode region 106. The electric field thus generated is relaxed by the part of the n$^-$-type silicon layer 104 between the anode and cathode regions 105 and 106. The magnitude of the relaxation effect to the electric field varies dependent upon the distance between the anode and cathode regions 105 and 106.

Figure 2:
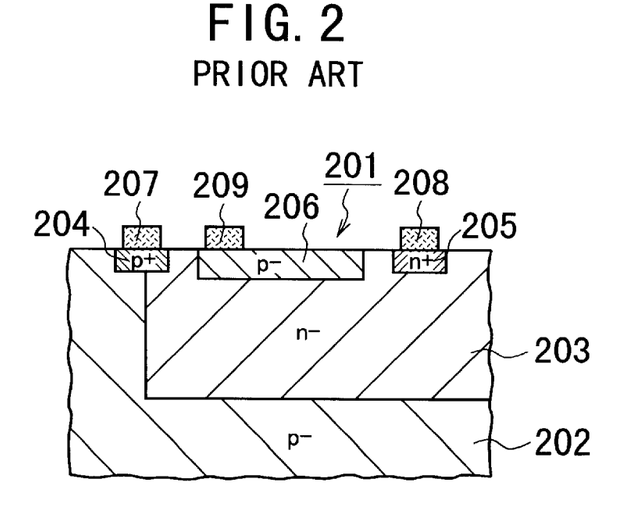
FIG. 2 is a partial cross-sectional view of another conventional high breakdown-voltage diode, which has the double RESURF structure decreasing the breakdown voltage.

FIG. 2 shows a partial cross section of another conventional high breakdown-voltage diode, which has the double REduced SURface Field (RESURF) structure increasing the breakdown voltage.

In FIG. 2, the conventional high breakdown-voltage diode 201 includes a p$^-$-type single-crystal silicon substrate 202. An n$^-$-type well 203 is formed in the substrate 202 by selective diffusion.

A p$^+$-type diffusion region 204 serving as an anode region of the diode 201 is formed in the surface area of the substrate 202 to be overlapped with the boundary of the well 203 by selective diffusion. The surface of the p$^+$-type anode region 204 is exposed from the substrate 202.

An n$^+$-type diffusion region 205 serving as a cathode region of the diode 201 is formed in the surface area of the substrate 202 by selective diffusion. The cathode region 205 is not overlapped with the boundary of the well 203 and is apart from the anode region 204. The surface of the n$^+$-type cathode region 205 is exposed from the substrate 202.

A p$^-$-type electric-field relaxation region 206 is formed in the surface area of the substrate 202 between the anode and cathode regions 204 and 205 by selective diffusion. The surface of the p$^-$-type electric-field relaxation region 206 is exposed from the substrate 202. The relaxation region 206 is apart from the anode and cathode regions 204 and 205.

An anode electrode 207 is formed on the exposed surface of the p$^+$-type anode region 204. The anode electrode 207 is electrically connected to the p$^+$-type anode region 204.

A cathode electrode 208 is formed on the exposed surface of the n$^+$-type cathode region 205. The cathode electrode 208 is electrically connected to the n$^+$-type cathode region 205.

An electric-field relaxation electrode 209 is formed on the exposed surface of the p$^-$-type electric-field relaxation region 206. The electric-field relaxation electrode 209 is electrically connected to the electric-field relaxation region 206.

Although not shown in FIG. 2, the anode electrode 207 is electrically connected to the electric-field relaxation electrode 209, so that these two electrodes 207 and 209 have the same electric potential on operation.

With the conventional high breakdown-voltage diode 201 shown in FIG. 2, a reverse voltage is applied across the anode and cathode electrodes 207 and 208 on operation. At the same time, the same reverse voltage is applied across the electric-field relaxation electrode 209 and the cathode electrode 208, because the anode and electric-field relaxation electrodes 207 and 209 are electrically connected to one another.

Due to the applied reverse voltage, a first depletion region (not shown in FIG. 2), which is formed at the p$^-$n$^-$ junction of the p$^-$-type electric-field relaxation region 206 and the n$^-$-type well 203, grows upward and downward. As a result, the upper end of the first depletion region reaches the surface of the well 203, thereby depleting the relaxation region 206 completely. The lower end of the first depletion region approaches the interface between the n⁻-type well 203 and the p⁻-type remaining substrate 202

On the other hand, a second depletion region (not shown in FIG. 2), which is formed at the p⁻-n⁻ junction of the n⁻-type well 203 and the p⁻-type remaining substrate 202, grows upward and downward due to the applied reverse voltage. The upper end of the second depletion region reaches the lower end of the first depletion region in the well 203, resulting in merge of the first and second depletion regions. Thus, the part of the well 203 below the p⁻-type electric-field relaxation region 206 is completely depleted.

As described above, the electric field existing in the vicinity of the p⁺-n⁻ junction of the n⁻-type well 203 and the p⁺-type anode region 204 is relaxed due to the existence of the first and second depletion regions. In other words, a large part of the applied reverse voltage acts on the first and second depletion regions. As a result, the effective voltage to form the electric field in the vicinity of the p⁺-n⁻ junction is decreased, increasing the breakdown voltage of the conventional diode 201.

However, the above conventional high breakdown-voltage diodes 101 and 201 have the following problems.

With the conventional diode 101 shown in FIG. 1, the electric field generated in the device region 104a is relaxed by the part of the n⁻-type single-crystal silicon layer 104 which is vertically and laterally isolated by the SiO₂ layer 103 and the isolation region 107. Therefore, the doping concentration of the n⁻-type single-crystal silicon layer 104 needs to be set as a comparatively low value so as to increase the width of a depletion region generated in the layer 104.

Also, to prevent the punch through phenomenon from occurring even when the depletion region formed at the p⁺-n⁻ junction of the p⁺-type anode region 105 and the n⁻-type device region 104a laterally grows toward the cathode region 106 due to the applied reverse voltage, the anode and cathode regions 105 and 106 are required to be apart from each other at a specific distance corresponding to a wanted breakdown voltage.

Accordingly, there is a problem that the electric resistance between the anode and cathode regions 105 and 106 after breakdown occurs is high and that the diode 101 occupies a large chip area.

With the conventional diode 201 shown in FIG. 2, because the anode electrode 207 is electrically connected to the electric-field relaxation region 206, the electric potentials of the anode electrode 207 and the electric-field relaxation region 206 are always equal. Usually, these two electric potentials are set as zero V.

As a result, there is a problem that the electric potential of the anode electrode 207 is unable to be set at an optional value other than zero V on operation.

SUMMARY OF THE INVENTION

Accordingly, an object of the present invention is to provide a high breakdown-voltage diode having a decreased chip area and a low electric resistance between anode and cathode regions after the breakdown phenomenon takes place.

Another object of the present invention is to provide a high breakdown-voltage diode in which the electric potential of an anode region is able to be optionally set as a desired value.

The above objects together with others not specifically mentioned will become clear to those skilled in the art from the following description.

A high breakdown-voltage diode according to the present invention is comprised of a semiconductor layer of a first conductivity type, which is vertically isolated by a first isolation dielectric and laterally isolated by a second isolation dielectric from outside of the isolated semiconductor layer.

A first diffusion region of a second conductivity type opposite to the first conductivity type is formed in a surface area of the semiconductor layer, thereby forming a first p-n junction at a boundary of the first diffusion region.

A second diffusion region of the first conductivity type is formed in the surface area of the semiconductor layer to be apart from the first diffusion region.

One of the first and second diffusion regions serves as an anode region of the diode and the other thereof serves as a cathode region thereof.

A third diffusion region of the second conductivity type is formed in the surface area of the semiconductor layer between the first and second diffusion regions, thereby forming a second p-n junction at a boundary of the third diffusion region. The third diffusion region is electrically connected to the first diffusion region.

A depletion region formed at the second p-n junction grows according to a reverse voltage applied across the first and second diffusion regions in such a way that a first end of the depletion region extends to a surface of the third diffusion region and a second end thereof extends to the first isolation dielectric while no breakdown occurs at the first p-n junction.

Thus, an electric field existing near the first p-n junction is relaxed due to the grown depletion region.

With the high breakdown-voltage diode according to the present invention, the depletion region formed at the second p-n junction grows according to the reverse voltage applied across the first and second diffusion regions in such a way that the first and second ends of the depletion region extend respectively to the surface of the third diffusion region and the first isolation dielectric while no breakdown occurs at the first p-n junction. Thus, the electric field existing near the first p-n junction is relaxed due to the grown depletion region.

The relaxation of the electric field prevents the punch through phenomenon from occurring between the first and second diffusion regions. Therefore, the distance between the first and second diffusion regions is able to be decreased, resulting in a decreased chip area of the diode.

Also, the relaxation of the electric field allows the doping concentration of the semiconductor layer to be raised. Accordingly, the electric resistance between the first and second diffusion regions (i.e., the anode and cathode regions) after breakdown takes place is able to be lowered.

Further, because the semiconductor layer is vertically isolated by the first isolation dielectric and laterally isolated by the second isolation dielectric from outside of the isolated semiconductor layer, the electric potential of the anode region is able to be optionally set as a desired value.

In a preferred embodiment of the diode according to the present invention, the third diffusion region has an end surface contacted with the second isolation dielectric. In this case, there is an additional advantage that punch through phenomenon is prevented from occurring at the end surface of the third diffusion region.

In another preferred embodiment of the diode according to the present invention, the third diffusion region has an end surface opposite to and apart from the second isolation dielectric. The depletion region formed at the second p-n junction are contacted with in the vicinity of the end surface of the third diffusion region. In this case, there is an additional advantage that punch through phenomenon is prevented from occurring at the end surface of the third diffusion region.

In still another preferred embodiment of the diode according to the present invention, the third diffusion region entirely surrounds one of the first and second diffusion regions. In this case, there is an additional advantage that punch through phenomenon is prevented from occurring at all end surfaces of the third diffusion region.

In a further preferred embodiment of the diode according to the present invention, the third diffusion region almost entirely surrounds one of the first and second diffusion regions. The one of the first and second diffusion regions is contacted with the second isolation dielectric through an opening of the third diffusion region. In this case, there is an additional advantage that punch through phenomenon is prevented from occurring at all end surfaces of the third diffusion region.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Preferred embodiments of the present invention will be described below referring to the drawings attached.

First Embodiment

Figure 3:
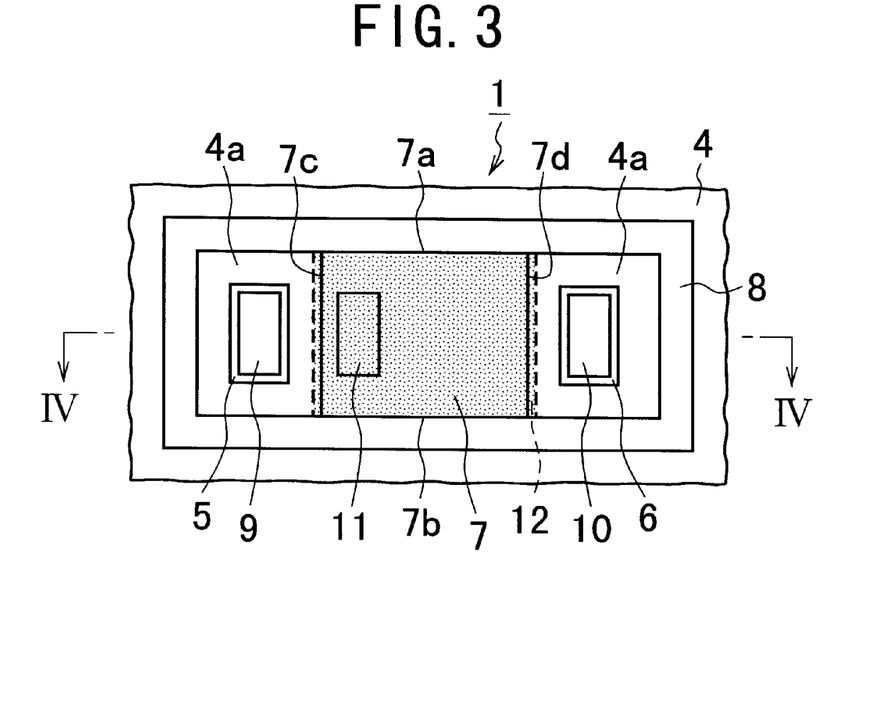
FIG. 3 is a partial plan view of a high breakdown-voltage diode according to a first embodiment of the present invention.
Figure 4:
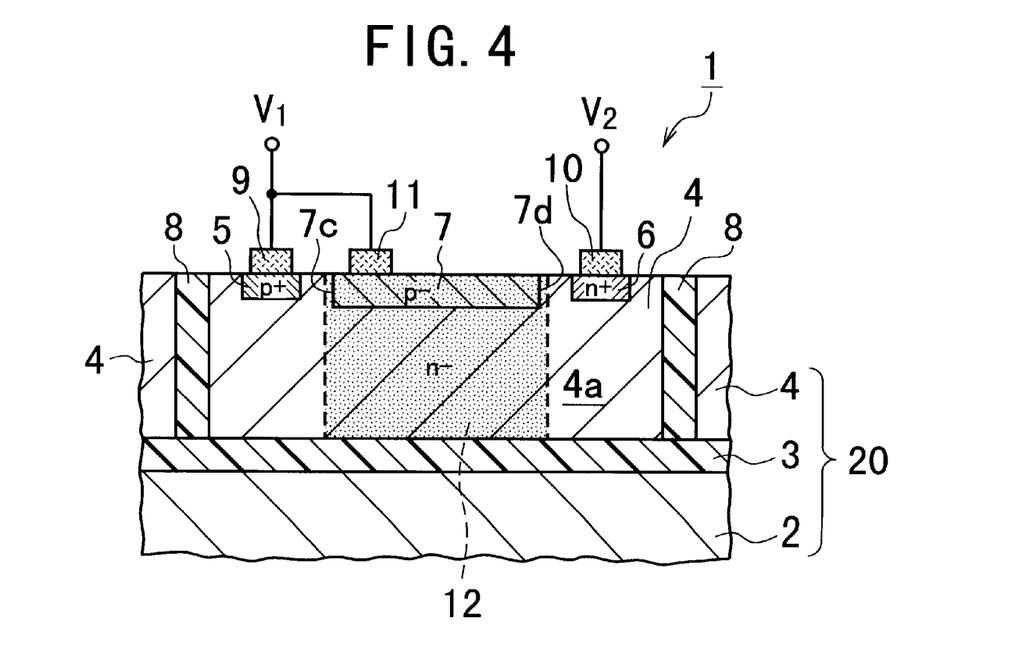
FIG. 4 is a partial cross-sectional view of the high breakdown-voltage diode according to the first embodiment, which is along the line IV—IV in FIG. 3.

As shown in FIGS. 3 and 4, a high breakdown-voltage diode 1 according to a first embodiment is formed on an SOI substrate 20. This diode 1 has a breakdown voltage of 150 V.

FIG. 4, the high breakdown-voltage diode 1 according to the first embodiment includes an SOI substrate 20. This substrate 20 consists of a $n^-$- or $p^-$-type single-crystal silicon supporting plate 2, a $SiO_2$ layer 3 formed on the plate 2, and an $n^-$-type single-crystal silicon layer 4 formed on the $SiO_2$ layer 3. The $p^-$-type supporting plate 2 has a doping concentration of $1\times10^{14}$ atoms/cm$^3$. The $SiO_2$ layer 3 has a thickness of 1 $\mu$m. The $n^-$-type single-crystal silicon layer 4 has a doping concentration of $1\times10^{16}$ atoms/cm$^3$ and a thickness of 5 $\mu$m.

An isolation region 8 made of $SiO_2$ is formed in the $n^-$-type silicon layer 4 to surround an area where the diode 1 is formed, defining a rectangular-shaped device region 4a in the layer 4. The isolation region 8 has a width of 1 $\mu$m. The bottom end of the isolation region 8 is contacted with the underlying $SiO_2$ layer 3. The device region 4a is laterally isolated by the isolation region 8 and vertically isolated by the $SiO_2$ layer 3 from other electronic elements or components located outside the device region 4a.

A $p^+$-type diffusion region 5 serving as an anode region of the diode 1 is formed in the surface area of the device region 4a by selective diffusion, thereby forming a $p^+$-$n^-$ junction at a boundary of the region 5. The surface of the $p^+$-type anode region 5 is exposed from the single-crystal silicon layer 4 and is apart from the isolation region 7. The anode region 5 has a doping concentration of $1\times10^{19}$ atoms/cm$^3$ or higher and a depth of 1 $\mu$m from the surface of the layer 4.

An $n^+$-type diffusion region 6 serving as a cathode region of the diode 1 is formed in the surface area of the device region 4a by selective diffusion. The surface of the $n^+$-type cathode region 6 is exposed from the single-crystal silicon layer 4 and apart from the isolation region 7 and from the anode region 5. The cathode region 6 is formed in such a way that the distance between the opposing edges of the anode and cathode regions 5 and 6 is 8 $\mu$m. The cathode region 6 has a doping concentration of $1\times10^{19}$ atoms/cm$^3$ or higher and a depth of 1 $\mu$m from the surface of the layer 4.

A $p^-$-type electric-field relaxation region 7 is formed in the surface area of the device region 4a between the anode and cathode regions 5 and 6 by selective diffusion, thereby forming a $p^-$-$n^-$ junction at a boundary of the region 7. The surface of the $p^-$-type electric-field relaxation region 7 is exposed from the single-crystal silicon layer 4. The relaxation region 7 is apart from the anode and cathode regions 5 and 6. The electric-field relaxation region 7 has a doping concentration of $6\times10^{16}$ atoms/cm$^3$, a depth of 1 $\mu$m from the surface of the layer 4, and a length of 6 $\mu$m along a straight line connecting the anode and cathode regions 5 and 6.

An anode electrode 9 is formed on the exposed surface of the $p^+$-type anode region 5. The anode electrode 9 is electrically connected to the anode region 5.

A cathode electrode 10 is formed on the exposed surface of the $n^+$-type cathode region 6. The cathode electrode 10 is electrically connected to the cathode region An electric-field relaxation electrode 11 is formed on the exposed surface of the $p^-$-type electric-field relaxation region 7. The electric-field relaxation electrode 11 is electrically connected to the electric-field relaxation region 7 and the anode electrode 9. The electrode 11 has a distance of 6 $\mu$m or more from the inner end of the cathode region 6.

As clearly shown in FIG. 3, the device region 4a has a rectangular plan shape. The $p^+$-type anode region 5 and the $n^+$-type cathode region 6 have approximately the same rectangular plan shape. The electric-field relaxation region 7 has a rectangular plan shape.

All the end surfaces of the anode region 5 are apart from the isolation region 8 and the p⁻-type electric-field relaxation region 7. All the end surfaces of the cathode region 6 are apart from the isolation region 8 and the electric-field relaxation region 7.

Two end surfaces 7a and 7b of the electric-field relaxation region 7, which are not opposed to the anode and cathode regions 5 and 6, are contacted with the corresponding inner surfaces of the isolation region 8. The other remaining two end surfaces 7c and 7d of the electric-field relaxation region 7, which are opposed to the anode and cathode regions 5 and 6, are not contacted with the corresponding inner surfaces of the isolation region 8.

With the high breakdown-voltage diode 1 according to the first embodiment shown in FIGS. 3 and 4, on operation, the anode electrode 9 and the electric-field relaxation electrode 11 are applied with a voltage $V_1$ and the cathode electrode 10 is applied with a voltage $V_2$, where $V_2>V_1$. In this case, a reverse voltage of $(V_2-V_1)$ is applied across the anode and cathode regions 5 and 6.

In this case, as shown in FIG. 4, a depletion region 12 formed at the p⁻-n⁻ junction of the p⁻-type electric-field relaxation region 7 grows according to the applied reverse voltage $(V_2-V_1)$ in such a way that an upper end of the depletion region 12 extends to the surface of the relaxation region 7 and a lower end thereof extends to the isolation $SiO_2$ layer 3 while no breakdown occurs at the p⁺-n⁻ junction of the anode region 5. This may be readily implemented by suitably controlling the doping concentration of the n⁻-type single-crystal silicon layer 4 and the p⁻-type electric-field relaxation region 7.

Thus, an electric field existing near the p⁺-n⁻ junction of the anode region 5 is relaxed due to the grown depletion region 12. The relaxation of the electric field prevents the punch through phenomenon from occurring between the anode and cathode regions 5 and 6. Therefore, the distance between the anode and cathode regions 5 and 6 is able to be decreased, resulting in a decreased chip area of the diode 1.

Also, the relaxation of the electric field allows the doping concentration of the n⁻-type single-crystal silicon semiconductor layer 4 to be raised. Accordingly, the electric resistance between the anode and cathode regions 5 and 6 after breakdown takes place is able to be lowered.

Further, because the semiconductor layer 4 is vertically isolated by the $SiO_2$ layer 3 and laterally isolated by the $SiO_2$ isolation region 6 from outside of the isolated part of the semiconductor layer 4a, the electric potential of the anode region is able to be optionally set as a desired value.

The breakdown voltage of the diode 1 according to the first embodiment is determined by the length of the electric-field relaxation region 7. As described previously, this diode 1 has a breakdown voltage of 150 V. If the length of the electric-field relaxation region 7 is increased, the breakdown voltage of the diode 1 may become as high as 2000 V under the condition that (i) no punch through occurs between the electric-field relaxation region 7 and the cathode electrode 6 and that (ii) the distance between the opposing ends of the cathode and the electric-field relaxation electrodes 10 and 11 is set as 10 μm or longer.

In the first embodiment in FIGS. 3 and 4, the isolation region 8 is formed by filling $SiO_2$ into a recess in the single-crystal silicon layer 4. Instead of $SiO_2$, polysilicon may be filled into the recess. The isolation region 8 may be formed by forming a $SiO_2$ film in the recess in the single-crystal silicon layer 4 and by filling polysilicon into the recess, instead of $SiO_2$. Any other oxide or silicon nitride may be used for this purpose.

Second Embodiment

Figure 5:
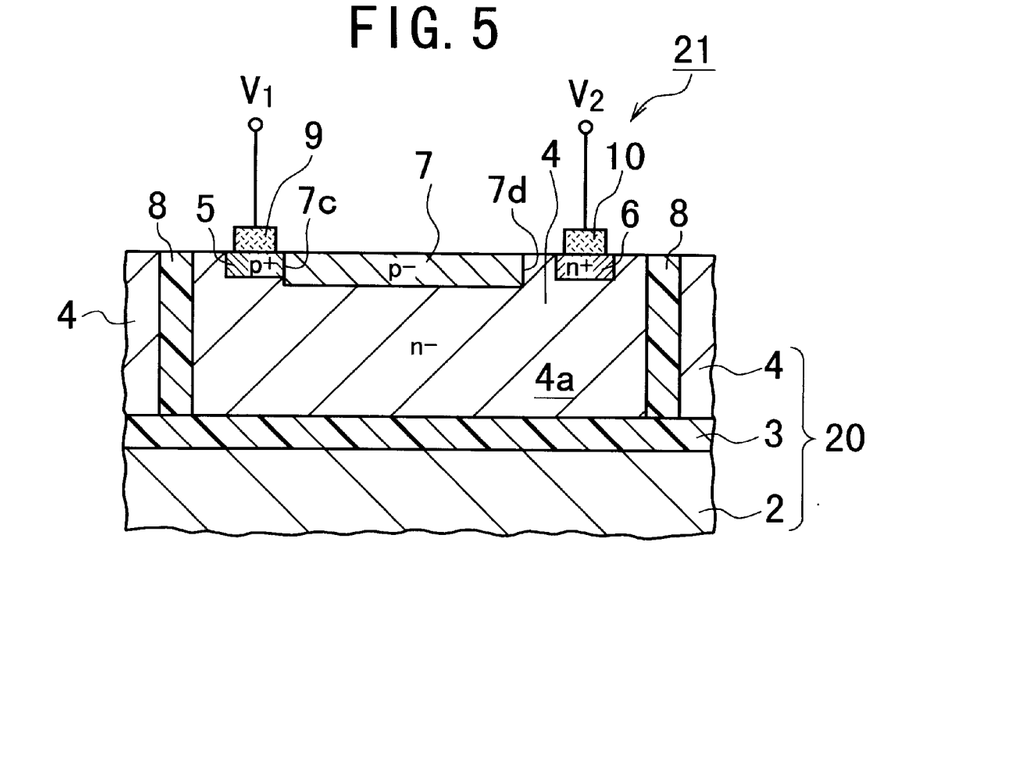
FIG. 5 is a partial cross-sectional view of a high breakdown-voltage diode according to a second embodiment of the present invention.

FIG. 5 shows a high breakdown-voltage diode 21 according to a second embodiment.

This diode 21 has the same configuration as that of the diode 1 according to the first embodiment in FIGS. 3 and 4, except that the end surface 7c of the p⁻-type electric-field relaxation region 7 is formed to be contacted with the opposite end surface of the anode region 5. Therefore, the explanation about the same configuration is omitted here by attaching the same reference numerals to the same or corresponding elements in FIG. 5 for the sake of simplification.

It is obvious that the diode 21 according to the second embodiment has the same advantages as those in the first embodiment.

Further, since the end surface 7c of the electric-field relaxation region 7 is contacted with the opposite end surface of the anode region 5, the electric-field relaxation region 7 is electrically connected to the anode region 5. Accordingly, there is an additional advantage that the electric-field relaxation electrode 11 may be canceled, simplifying the configuration of the diode 21.

Third Embodiment

Figure 6:
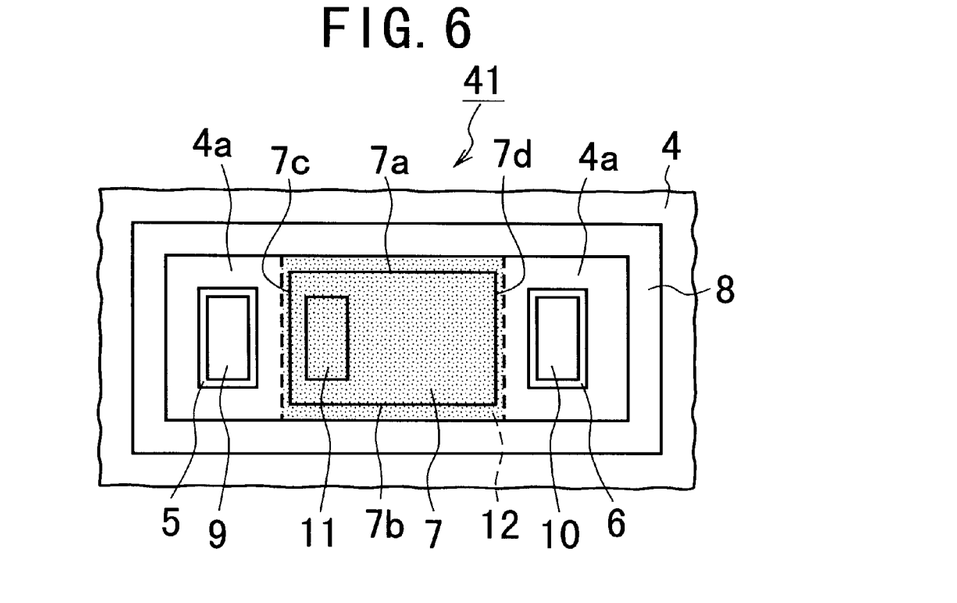
FIG. 6 is a partial plan view of a high breakdown-voltage diode according to a third embodiment of the present invention.

FIG. 6 shows a high breakdown-voltage diode 41 according to a third embodiment.

This diode 41 has the same configuration as that of the diode 1 according to the first embodiment in FIGS. 3 and 4, except that the two end surfaces 7a and 7b of the p⁻-type electric-field relaxation region 7 are apart from the opposite inner surfaces of the isolation region 8. Therefore, the explanation about the same configuration is omitted here by attaching the same reference numerals to the same or corresponding elements in FIG. 6 for the sake of simplification.

The remaining two end surfaces 7c and 7d of the p⁻-type electric-field relaxation region 7 also are apart from the opposite end surfaces of the anode and cathode regions 5 and 6.

The gaps between the end surface 7a or 7b of the electric-field relaxation region 7 and the corresponding end surfaces of the isolation region 8 are set in such a way that the depletion region 12 extends laterally to the isolation region 8 due to the applied reverse voltage. As a result, the diode 41 according to the third embodiment has the same advantages as those in the first embodiment.

Fourth Embodiment

Figure 7:
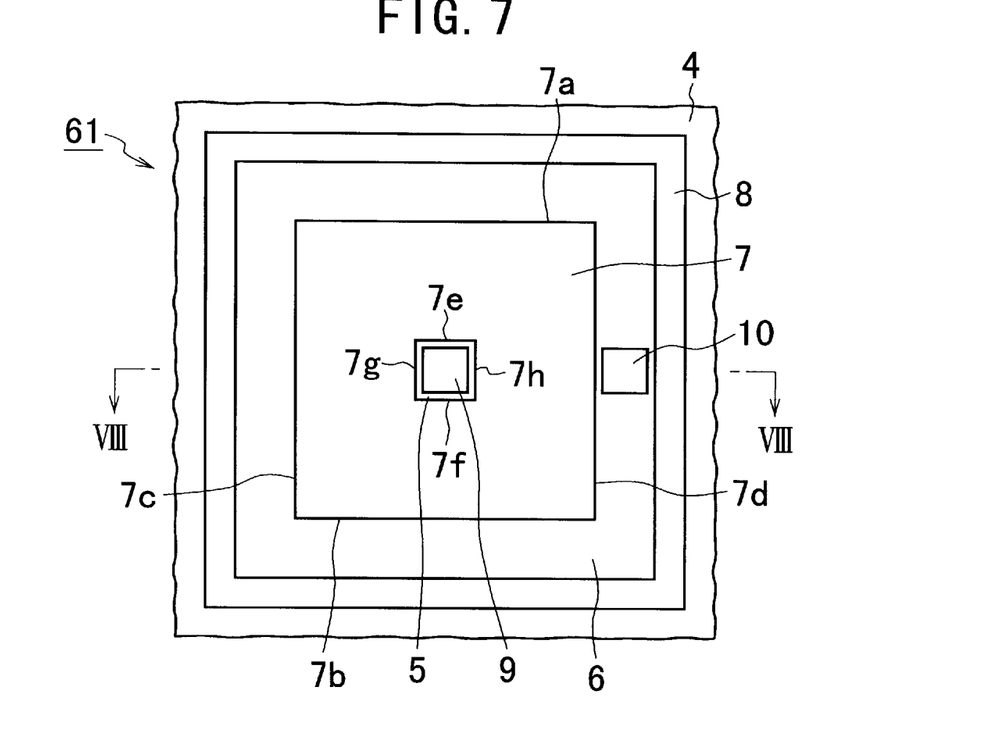
FIG. 7 is a partial plan view of a high breakdown-voltage diode according to a fourth embodiment of the present invention.
Figure 8:
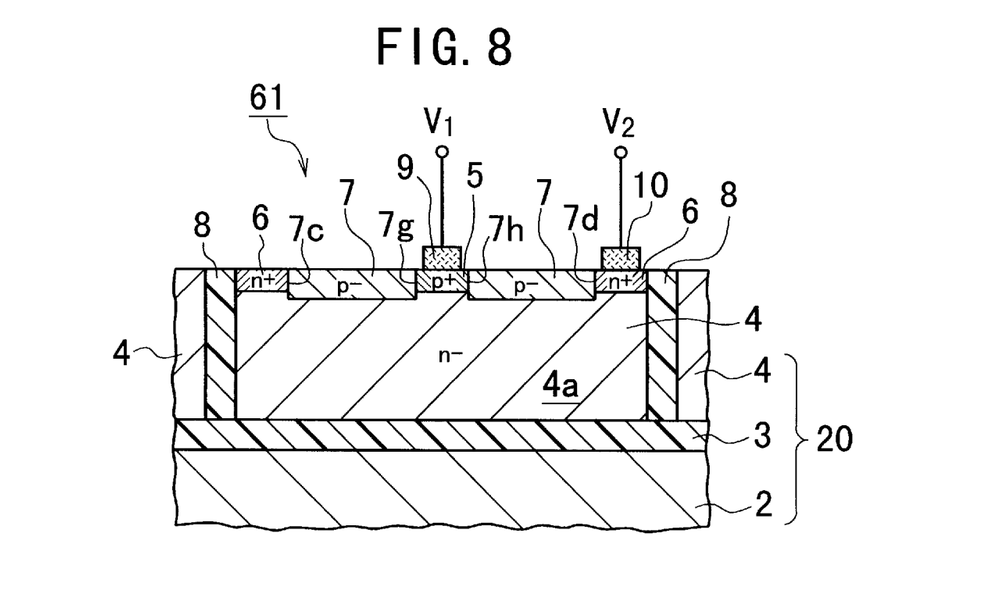
FIG. 8 is a partial cross-sectional view of the high breakdown-voltage diode according to the fourth embodiment, which is along the line VIII—VIII in FIG. 7.

FIGS. 7 and 8 show a high breakdown-voltage diode 61 according to a fourth embodiment.

This diode 61 has the sane configuration as that of the diode 1 according to the first embodiment in FIGS. 3 and 4, except that the square-ringed, n⁺-type cathode region 6 is formed to entirely surround the square-ringed electric-field relaxation region 7 and that the electric-field relaxation region 7 is formed to surround the square-shaped p⁺-type anode region 5.

The four end surfaces 7a, 7b, 7c, and 7d of the electric-field relaxation region 7 are contacted with the opposite end surfaces of the n⁺-type cathode region 6, respectively. The four end surfaces 7e, 7f, 7g, and 7h of the electric-field relaxation region 7 are contacted with the opposite end surfaces of the anode region 5, respectively.

In this case, because the square-ringed electric-field relaxation region 7 surrounds the square-shaped anode region 5, the square-ringed depletion region 12 is formed in the location below the region 7. As a result, there is an additional advantage that punch through phenomenon is prevented from occurring at all the end surfaces 7a, 7b, 7c, and 7d of the relaxation region 7 together with the same advantages as those in the first embodiment.

Fifth Embodiment

Figure 9:
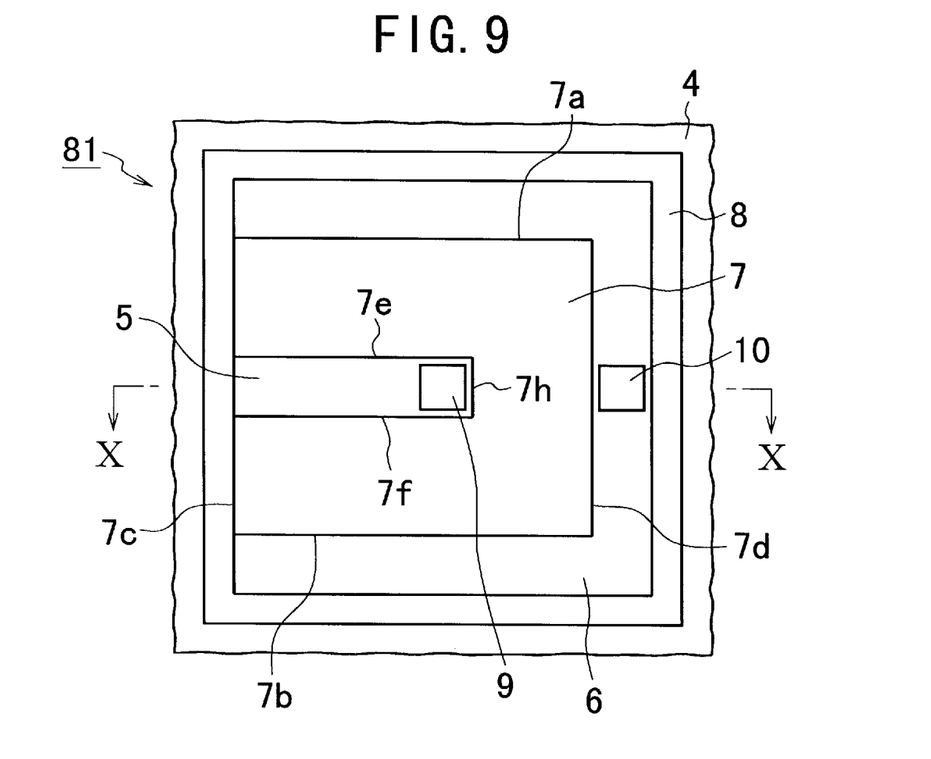
FIG. 9 is a partial plan view of a high breakdown-voltage diode according to a fifth embodiment of the present invention.
Figure 10:
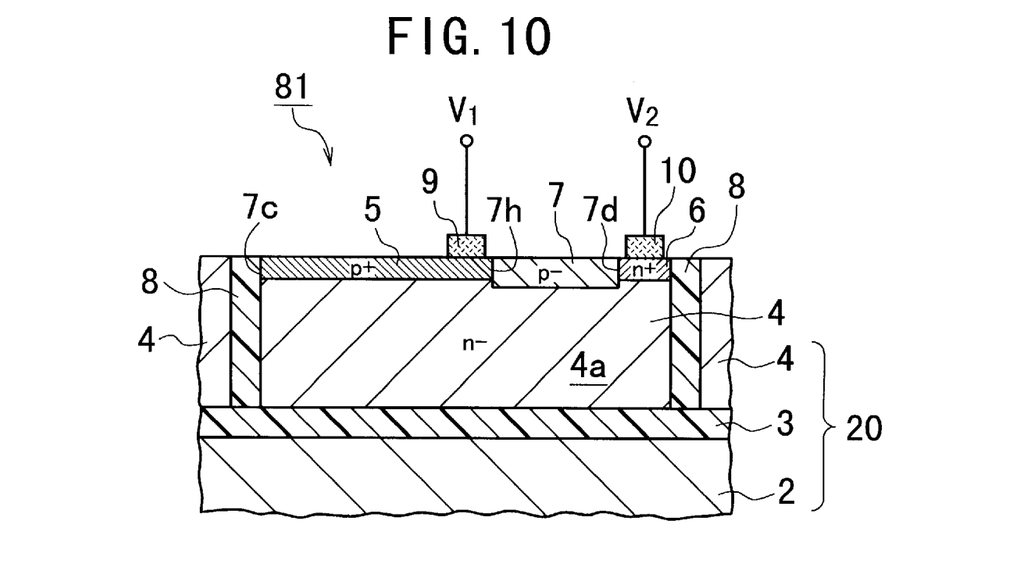
FIG. 10 is a partial cross-sectional view of the high breakdown-voltage diode according to the fifth embodiment, which is along the line X—X in FIG. 9.

FIGS. 9 and 10 show a high breakdown-voltage diode 81 according to a fifth embodiment.

This diode 81 has the same configuration as that of the diode 61 according to the fourth embodiment, except that the p⁻-type electric-field relaxation region 7 is formed to almost entirely surround the anode region 5. The cathode region 6 has a plan shape of a U-character and is contacted with the corresponding inner surfaces of the isolation region 8. The electric-field relaxation region 7 has a plan shape of a U-character and is located inside the cathode region 6, The p⁺-type anode region has a plan shape of a strip.

The three end surfaces 7a, 7b, and 7d of the electric-field relaxation region 7 are contacted with the opposite end surfaces of the n⁺-type cathode region 6, respectively. The end surface 7c of the electric-field relaxation region 7 is contacted with the opposite inner surface of the isolation region 8. The three end surfaces 7e, 7f, and 7h of the electric-field relaxation region 7 are contacted with the opposite end surfaces of the anode region 5, respectively. The remaining end surface of the anode region 5 is contacted with the inner surface of the isolation region 8.

The depletion region causes no breakdown at the p⁻n⁺ junction of the electric-field relaxation region 7 and the cathode region 6 prior to that at the p⁺-n⁻ junction of the anode region 5 and the semiconductor layer 4.

In this case, because the U-shaped electric-field relaxation region 7 and the isolation region 8 surround the strip-shaped anode region 5, the U-shaped depletion region is formed in the location below the region 7. As a result, there is an additional advantage that punch through phenomenon is prevented from occurring at all end surfaces 7a, 7b, and 7d of the relaxation region 7 together with the same advantages as those in the first embodiment.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A high breakdown-voltage diode comprising:
a semiconductor layer of a first conductivity type;
said semiconductor layer being vertically isolated by a first isolation dielectric and laterally isolated by a second isolation dielectric disposed peripherally about said semiconductor layer;
a first diffusion region of a second conductivity type opposite to said first conductivity type;
said first diffusion region being formed in a surface area of said semiconductor layer, thereby forming a first p-n junction at a boundary of said first diffusion region;
a second diffusion region of said first conductivity type formed in said surface area of said semiconductor layer to be apart from said first diffusion region;
one of said first and second diffusion regions serving as an anode region of said diode and the other thereof serving as a cathode region thereof;
a third diffusion region of said second conductivity type formed in said surface area of said semiconductor layer between said first and second diffusion regions, thereby forming a second p-n junction at a boundary of said third diffusion region; and
said third diffusion region being electrically connected to said first diffusion region and having end faces contacted with said second isolation dielectric;
wherein a depletion region formed at said second p-n junction grows according to a reverse voltage applied across said first and second diffusion regions in such a way that a first end of said depletion region extends to a surface of said third diffusion region and a second end thereof extends to said first isolation dielectric while no breakdown occurs at the first p-n junction;
whereby an electric field existing near said first p-n junction is relaxed due to said grown depletion region.

2. A diode as claimed in claim 1, wherein said third diffusion region entirely surrounds one of said first and second diffusion regions.

3. The high breakdown-voltage diode of claim 1, wherein the end faces of said third diffusion region are oriented in opposite directions.

4. A high breakdown-voltage diode comprising:
a semiconductor layer of a first conductivity type;
said semiconductor layer being vertically isolated by a first insolation dielectric and laterally isolated by a second isolation dielectric disposed peripherally about said semiconductor layer;
a first diffusion region of a second conductivity type opposite to said first conductivity type;
said first diffusion region formed in a surface area of said semiconductor layer, thereby forming a first p-n junction at a boundary of said first diffusion region;
a second diffusion region of said first conductivity type formed in said surface area of said semiconductor layer to be apart from said first diffusion region;
one of said first and second diffusion regions serving as an anode region of said diode and the other thereof serving as a cathode region therof;
a third diffusion region of said second conductivity type formed in said surface area of said semiconductor layer between said first and second diffusion regions, thereby forming a second p-n junction at a boundary of said third diffusion region; and
said third diffusion region being electrically connected to said first diffusion region and almost entirely surrounding one of said first and second diffusion regions;
wherein said one of said first and second diffusion regions is contacted with said second isolation dielectric through an opening of said third diffusion region, and
wherein depletion region formed at said second p-n junction grows according to a reverse voltage applied across said first and second diffusion regions in such a way that a first end of said depletion region extends to a surface of said third diffusion region and a second end thereof extends to said first isolation dielectric while no breakdown occurs at the first p-n junction;
whereby an electric field existing near said first p-n junction is relaxed due to said grown depletion region.

5. A semiconductor diode, comprising:
a device region being a first conductivity type and having a surface area;
an isolation region surrounding at least a portion of said device region;
a first diffusion region formed within said device region and being said first conductivity type;

a second diffusion region formed within said device region and being a second conductivity type different from said first conductivity type; and a third diffusion region formed within said device region between said first and second diffusion regions and being said second conductivity type, wherein said second and third diffusion regions are maintained at a same electrical potential and said third diffusion region having end faces contacted with said isolation region.

6. A semiconductor diode, according to claim 5, wherein said first conductive type is n-type and said second conductive type is p-type.

7. A semiconductor diode, according to claim 5, wherein said isolation region includes a horizontal portion substantially parallel to said surface area and a plurality of vertical portions substantially perpendicular to said surface area.

8. A semiconductor diode, according to claim 7, wherein a portion of each of said diffusion regions coincides with said surface area.

9. A semiconductor diode, according to claim 5, further comprising:

a first electrode connected to said first diffusion region;

a second electrode connected to said second diffusion region; and a third electrode connected to said third diffusion region and to said second electrode.

10. A semiconductor diode, according to claim 5, wherein said second diffusion region is in contact with said third diffusion region.

11. A semiconductor diode, according to claim 10, wherein said third diffusion region substantially surrounds said second diffusion region.

12. The high breakdown-voltage diode of claim 5, wherein the end faces of said third diffusion region are oriented in opposite directions.

13. A semiconductor diode, comprising:

device region means, of a first conductivity type, for holding components of said semiconductor diode;

first diffusion region means, formed within said device region means and being said first conductivity type, for providing a cathode of the semiconductor diode;

second diffusion region means, formed within said device region means and being a second conductivity type different from said first conductivity type, for providing an anode of the semiconductor diode;

third diffusion region means, formed within said device region means between said first and second diffusion region means and being said second conductivity type, for providing an electric field relaxation region;

means for maintaining said second and third diffusion region means at a same electrical potential; and isolation means, for electrically isolating said device region means, wherein said third diffusion region means has end faces contacted with said isolation means.

14. A semiconductor diode, according to claim 13, further comprising means for maintaining said second and third diffusion region means at a same electrical potential, wherein and means for maintaining said second and third diffusion region means at a same electrical optical includes electrically connecting said second and third diffusion region means via electrodes corresponding to said second and third diffusion region means.

15. A semiconductor diode, according to claim 14, wherein said means for maintaining said second and third diffusion region means at a same electrical potential includes having said second diffusion regions means be in contact with said third diffusion region means.

16. A semiconductor diode, according to claim 13, wherein said second diffusion region means form a first p-n junction with said device region means and said third diffusion region means forms a second p-n junction with said device region means, and wherein said electric field relaxation region formed at said second p-n junction relaxes an electric field formed at said first p-n junction.

* * * * *